(12) United States Patent
Wenzel et al.

(10) Patent No.: US 7,468,931 B2
(45) Date of Patent: Dec. 23, 2008

(54) MEMORY DEVICE AND METHOD FOR OPERATING A MEMORY DEVICE

(75) Inventors: Andreas Wenzel, Munich (DE); Stefan Ruping, Lengdorf (DE); Steffen M. Sonnekalb, Taufkirchen (DE)

(73) Assignee: Infineon Technologies AG (DE)

( * ) Notice: Subject to any disclaimer, the term of this patent is extended or adjusted under 35 U.S.C. 154(b) by 258 days.

(21) Appl. No.: 11/458,243

(22) Filed: Jul. 18, 2006

(65) Prior Publication Data
US 2007/0136505 A1 Jun. 14, 2007

(30) Foreign Application Priority Data
Jul. 18, 2005 (DE) .................. 10 2005 033 473

(51) Int. Cl.
*G11C 8/00* (2006.01)
(52) U.S. Cl. .................. 365/230.06; 365/230.01; 365/230.08
(58) Field of Classification Search ............ 365/230.01, 365/230.08
See application file for complete search history.

(56) References Cited

U.S. PATENT DOCUMENTS

| 5,826,108 | A  | * | 10/1998 | Sonobe ................... 710/35 |
| 6,240,482 | B1 | * | 5/2001 | Gates et al. ............. 710/306 |
| 6,370,073 | B2 | * | 4/2002 | Leung .................... 365/222 |

FOREIGN PATENT DOCUMENTS

EP  0 829 086 B1  10/2001

\* cited by examiner

*Primary Examiner*—Thong Q Le
(74) *Attorney, Agent, or Firm*—Dickstein, Shapiro, LLP.

(57) ABSTRACT

A memory arrangement having a memory area with a plurality of memory locations, to which external addresses can be allocated, and an address decoder which is coupled to the memory area and which includes an address input for applying an external address. The address decoder can be switched so that one of the external addresses of an address range is allocated to each memory location of the memory area, or that one of the external addresses of a sub-address range of the address range is allocated to each memory location only within a part-memory area of the memory area. The address decoder is also arranged for identifying the memory location allocated to the external address applied.

41 Claims, 2 Drawing Sheets

| EA | IA | | | | | | |
|----|----|----|----|----|----|----|----|
| A1 | A1 | A2 | A2 | A3 | A3 | A4 | A4 |
| A5 | A5 | A6 | A6 | A7 | A7 | A8 | A8 |
| A9 | A9 | A10 | A10 | A11 | A11 | A12 | A12 |
| A13 | A13 | A14 | A14 | A15 | A15 | A16 | A16 |
| A17 | A17 | A18 | A18 | A19 | A19 | A20 | A20 |

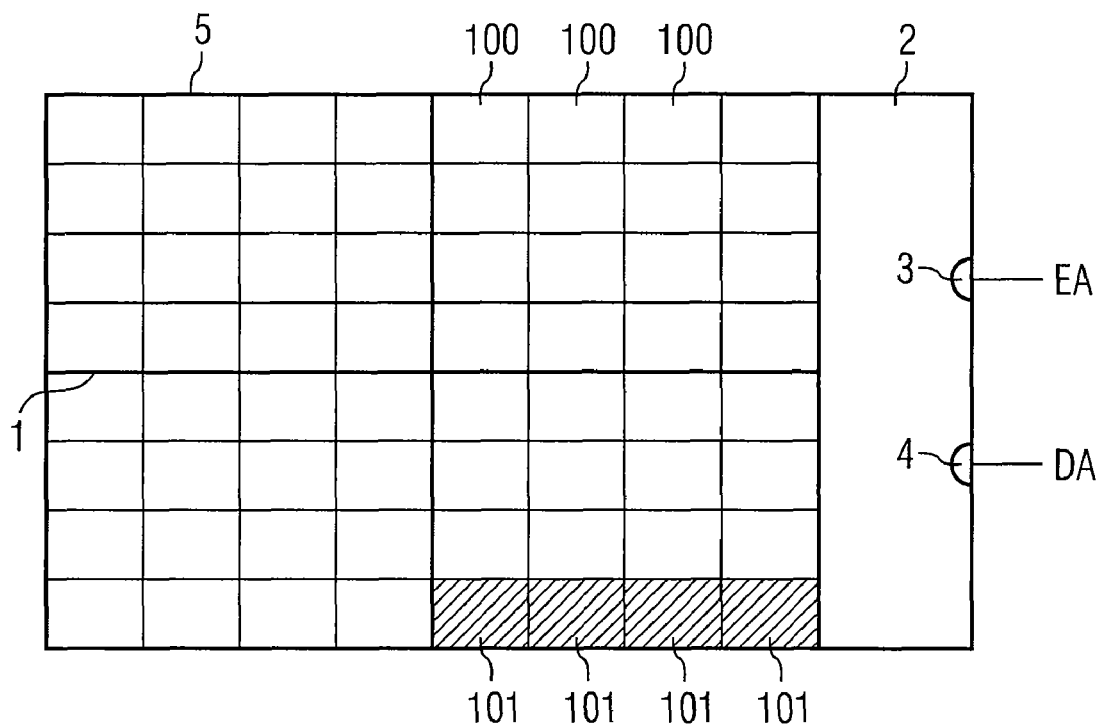

MEMORY DEVICE AND METHOD FOR OPERATING A MEMORY DEVICE

CROSS-REFERENCE TO RELATED APPLICATION

This application claims priority to German Patent Application Serial No. 102005033473.3, which was filed on Jul. 18, 2005, and is incorporated herein by reference in its entirety.

FIELD OF THE INVENTION

The invention relates to a memory arrangement and to a method for operating a memory arrangement.

BACKGROUND OF THE INVENTION

Memory arrangements are used in a large number of devices in order to store the data to be processed or generated in operation. A so-called main memory is arranged for providing large amounts of data, such as program data. As a rule, the main memory is not volatile. Apart from the main memory, intermediate memories which are volatile in most cases, are frequently also provided which can be accessed more quickly. In addition, there are also removable memory media which are connected to a suitable device for operation. In memory arrangements such as those mentioned above, a suitable device for managing the memory must be provided.

Memory arrangements typically comprise a large number of memory locations. In each memory location, a data word, which can comprise a number of bits or bytes can be stored. The memory locations are accessed via an address decoder with address inputs and data inputs and outputs. An external address is allocated to each memory location. In the arrangement described above, no checking capability is provided for checking whether the data content of the memory locations has changed during the storing. The changes can be of a random type such as, for example, due to natural radiation; but they can also be caused by deliberate manipulation for example, attacks such as "forcing" or aimed radiation.

To detect changes of stored data words, a part of the memory locations in many memory arrangements is reserved for redundant information. Redundant information allows conclusions to be drawn as to whether the stored data have been changed. Redundant information is generated, for example, in the form of a check word, either separately for each data word or for a record of a number of data words and stored at another place or another memory location. The stored check words have a given relationship with their associated data word or associated record of data words. During a later check of the check word with the associated data word or the associated record of data words, a check is made as to whether the given relationship exists. If this is not the case, the existence of a manipulation or of a change in the stored data words can be concluded.

A particularly simple form of redundant data is the so-called parity bit which is appended to a data word and specifies whether there is an even or odd number of a logical value, e.g. a logical one in the data word. Due to the parity bit, only an odd number of bit errors can be detected. More complex check words are based on so-called error-detecting or error-correcting codes which are suitable for detecting a number of bit errors or even correcting errors to a certain extent. Error-detecting or error-correcting codes are usually used for protecting a record of a number of data words by means of an associated check word.

The disadvantageous factor in this arrangement is that a relatively large proportion of the memory area is reserved for these check words and is not available for actual data storage. If a check word is allocated to four data words, 20% of the memory locations are reserved and are not available for actual data storage. This also applies if the data to be stored are not considered to be sensitive by the application or the user and do not need additional checking. Independently of whether the stored data are upgraded to be worthy of protection, a part of the memory locations is thus never accessible.

SUMMARY OF THE INVENTION

The invention relates to a memory arrangement with a memory area with a multiplicity of memory locations, to which external addresses can be allocated, and an address decoder which is coupled to the memory area and which comprises an address input for applying an external address. The address decoder can be switched so that one of the external addresses of an address range is allocated to each memory location of the memory area, or that one of the external addresses of a sub-address range of the address range is allocated to each memory location only within a part-memory area of the memory area. The address decoder is thus arranged for accessing the memory location to which the external address applied is allocated.

The method for operating such a memory arrangement with an address decoder, comprising an address input, and a memory area comprising a multiplicity of memory locations which can be accessed via an external address which can be applied to the address input and which can be allocated, comprises the following:
  a first operating mode in which an external address of an address range is in each case allocated to each memory location of the memory area, and
  a second operating mode in which an external address of a sub-range of the address range is allocated to each memory location only within a part-memory area of the memory area.

The extent of the memory area which can be protected is flexible due to the switching capability.

BRIEF DESCRIPTION OF DRAWINGS

FIG. 1 shows an exemplary embodiment of a memory arrangement;

FIG. 2 shows an allocation of external addresses to the memory locations of a memory area;

DETAILED DESCRIPTION OF THE INVENTION

Figure 3:
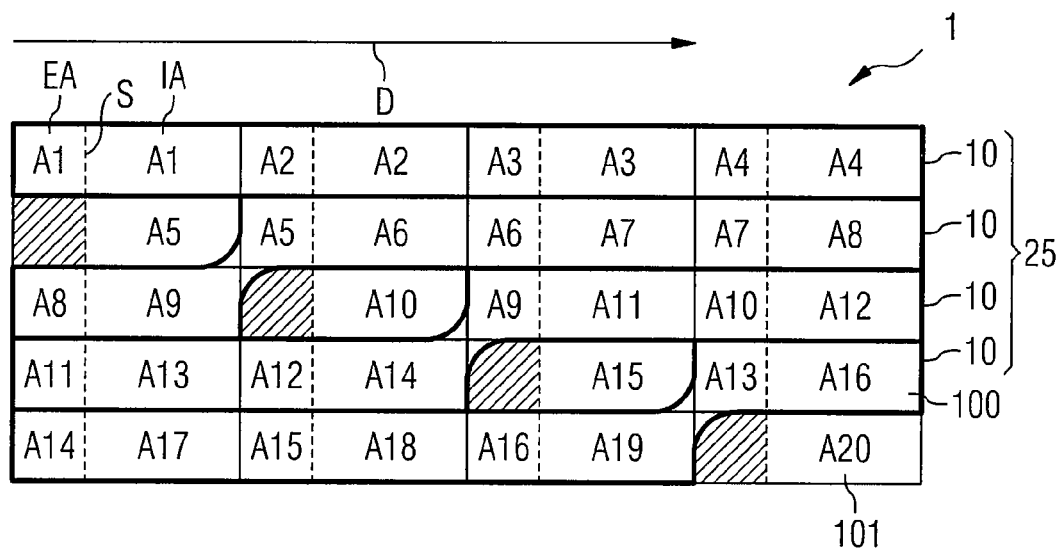
FIG. 3 shows a first allocation of external addresses to the memory locations of a part-memory area.

The address decoder is arranged for identifying the associated memory location when the external address is applied to the address input and providing access to this location. Access comprises either writing a data word into this memory location or reading the data word stored at this memory location. The external addresses usually extend to a linear address range in which the external addresses follow one another.

During protected operation of the circuit arrangement, a part of the memory locations is reserved for the check words. These reserved memory locations cannot be accessed from the outside and, in consequence, they do not have an external address. The external address can be called physical. Nevertheless, the address decoder is capable of identifying the check word for the corresponding data words since the correlation of the reserved memory locations with the corresponding records is predetermined.

Preferably, a record with a number of memory locations is correlated with at least one unaddressed memory location, i.e. one to which no external address is allocated, in order to store the redundant information for protecting the record. In this arrangement, all memory locations to which an external address is allocated are usually organized in records. All unaddressed memory locations are allocated to one of the records. The address decoder is arranged for identifying the memory location correlated with a record so that the data of the record can be checked by means of the stored redundant information.

The address decoder is arranged for identifying each memory location of the memory area by means of an internal address. Thus, the unaddressed memory locations are also unambiguously identifiable although they cannot be accessed from the outside. The internal addresses have a given relationship to the external addresses which are allocated from the address range. Thus, an internal address is unambiguously assigned to each of the memory locations. In the simplest case, the internal and external address are identical.

The records advantageously comprise memory locations with successive external addresses which simplifies the architecture of the address decoder and of the memory since the identification of the record only requires the address of one, in most cases of the first memory location of the record.

Since address management and the storage of data is usually in binary form, further simplifications are associated with the fact that the number of memory locations is a power of two.

In an advantageous embodiment, the same external address both from the sub-address range and from the address range cannot be allocated to each memory location. If only the addresses from the sub-address range are allocated, an internal readdressing of the memory takes place. The internal address of the correlated memory location comes before or after the internal addresses of the memory locations of the record. In this manner, the address decoder can identify the correlated unaddressed memory locations in a simple manner since the internal addresses have a fixed distance from those of the memory locations of the record.

To identify the memory location, a distance value from a given start address is allocated to the allocated external address. This internal start address usually specifies the first memory location of the memory area which also has an external address in most cases. The distance value specifies the distance of the external address from this first memory location. The distance value can be used for directly identifying the internal address of the memory location if an external address is allocated to each memory location.

If external addresses are only allocated to one part-memory area, the distance value which is based on the distance of the external addresses must be manipulated in order to identify the allocated memory location. If the internal address of the unaddressed memory location follows the addresses of the memory locations of the correlated record directly, the distance value allocated to the external addresses must be modified in order to identify the memory locations. This is because the address range of the external addresses is linear but the address range of the corresponding internal addresses is not. Described pictorially, the distance value must be stretched in order to provide an unaddressed memory location after each record.

In these cases, the correlated check word is stored in the immediate vicinity of the correlated record. The modification is preferably effected in such a manner that the distance value subjected to an integral division is added to the distance value so that, the greater the distance from the start address, the more the distance value is stretched.

It should be noted that integral division is understood to the be the integral part of the quotient of a division.

In the case of a binary representation of the distance value, a simple hardware implementation for manipulating the distance value is effected by adding the distance value shifted to the right to the instantaneous distance value. The shifting depends on the number of memory locations which a record comprises. Shifting to the right is equivalent to an integral division. The divisor is dependent on the number of places by which shifting is effected. The number of places by which shifting is effected, as exponent to the base 2, is the divisor. Conversely, shifting to the left is a multiplication by the number of shifted places as exponent to the base 2.

In a further advantageous embodiment, the same external address is allocated to each memory location, both from the sub-address range and from the address range. Thus, at least the same part-memory area is always available for access. The reservable part can be released for access if needed or is used as redundant memory location. The internal addresses of the unaddressed memory locations follow one another which is associated with clear memory allocation and management.

If the internal addresses of the unaddressed memory locations are selected in such a manner that they largely correspond to the addresses of the memory locations of the correlated record, the corresponding unaddressed memory location can be identified for each record in a simple manner in hardware. This particularly applies to a binary address representation.

The memory arrangement advantageously also comprises means for correlating, and storing in the correlated unaddressed memory location, a check word with data words stored in the memory locations of the record. Thus, by checking a given relationship between the data words which are stored in the memory locations of the record and the correlated check word, conclusions to any change or manipulation of data are possible.

An alternative embodiment comprises a memory area with a multiplicity of first and second memory locations to which external addresses can be allocated, and an address decoder which is coupled to the memory area and which comprises an address input for applying an external address. The address decoder can be switched so that, in a first operating mode, one of the external addresses of an address range is allocated to each first and second memory location of the memory area, or that, in a second operating mode, one of the external addresses of a sub-address range of the address range is only allocated to each first memory location of the memory area, wherein each first memory location is allocated to one of a multiplicity of records and each record is correlated with at least one of the second memory locations and wherein the address decoder is arranged for accessing the memory location allocated to the external address applied. This embodiment allows the protected operation or the memory volume to be given priority during operation.

Each of the first and second memory locations has an internal address. A memory location with an internal start address is allocated to an external start address of the address range. This type of addressing allows the memory locations to be identified.

Advantageously, the address decoder, in the first operating mode, determines a distance of the external address applied from the external start address and accesses the memory location, the internal address of which is the sum of the distance and of the internal start address. As a result, a linear address space with external addresses is mapped onto a linear address space with internal addresses.

The address decoder, in the second operating mode, determines a distance of the external address applied from the external start address and accesses the memory location, the internal address of which is the sum of the internal start address, of the distance and of a value, the value being the result of an integral division of the distance via the number of memory locations in one of the records. In this manner, the external address space is mapped onto the internal address space by an expansion of the distance.

The internal address of a second memory location to which a record of first memory locations with external addresses is allocated comprises the sum of the internal start address and the product of the integral division of the distance of one of the external addresses and the number of memory locations in one of the records. The second memory locations have an internal address before or after the internal addresses of the associated record of first memory locations.

As an alternative, the address decoder, in the second operating mode, determines a distance of the external address applied from the external start address and accesses the memory location, the internal address of which is the sum of the distance and of the internal start address. Thus, only a part of the memory area is released for access from the outside. The allocation of the internal addresses to the external addresses is unchanged for this part in the first and second operating mode.

The internal address of a second memory location which is allocated to a record of first memory locations with external addresses, comprises the sum of the internal start address, a predetermined value and the integral division of the distance of one of the external addresses. These internal addresses are located in another area of the memory than the addresses which can be accessed.

Even with the corresponding method for advantageously operating such a memory arrangement, an unaddressed memory location in which the check word belonging to the record is stored is correlated with a record having a number of memory locations in the second operating mode.

To identify each memory location, an internal address is provided in order to deposit or read out the desired data content at an unambiguous location. This internal address advantageously has a given relationship to the external address allocated in the first operating mode and, at best, they are identical so that no complicated address transfer of the external address into the internal address is required in this case. For the simple identification of the memory locations of a record, they have successive external addresses.

The memory locations are advantageously identified by means of a distance value which specifies the distance of the external address from a given start address. In the first operating mode, the internal address can thus be easily identified since no unaddressed memory locations are provided and a linear address range with external addresses is mapped onto a linear area of internal addresses. In a second operating mode, the memory location is identified by a modification of the distance value. Thus, the same external address is not necessarily allocated to the same memory location in the first and in the second operating mode.

As an alternative, the same external address can be allocated to each memory location both from the sub-address range and from the address range. In this case, a large proportion of the internal addresses of the memory locations of the record advantageously matches the internal address of the correlated unaddressed memory location, facilitating identification. This particularly applies when the addresses are represented in binary form.

In the case of a binary representation of the operands, the operation used in the allocation of the memory locations to external addresses can be implemented by shifting which is associated with a simple hardware implementation by means of a shift register.

An embodiment of the method for operating a memory arrangement comprises the following: a first operating mode in which an external address of an address range is in each case allocated to each first and each second memory location of the memory area, and a second operating mode in which an external address from a sub-range of the address range is allocated to only the first memory locations of the memory area wherein the first memory locations are in each case allocated to one of a multiplicity of records and at least one second memory location is correlated with each of the records. It is thus possible to switch from a normal first operating mode into a protected second operating mode.

Advantageous embodiments of the method are based on advantageous embodiments of the alternative embodiment of the circuit arrangement.

In the text which follows, the invention will be explained by means of exemplary embodiments, referring to the drawings.

FIG. 1 shows a memory arrangement with a memory array 5 which comprises a number of memory areas 1, in each case with a multiplicity of memory locations 100. It is also conceivable that the memory array 5 comprises only one memory area 1. Furthermore, the memory arrangement comprises an address decoder 2 which is coupled to the memory array 5. The address decoder 2 comprises an address input 3 and a data input/output 4. It is also conceivable that a separate data input and a separate data output are provided instead of one data input/output 4. To the address input 3, an external address EA is applied by means of which the address decoder 2 identifies the memory location 100 at which a data word DA present at the data input/output 4 is to be stored or, respectively, from which location the data word DA to be output at the data input/output 4 is to be read out. For the external address EA applied to the address input 3, the address decoder 2 thus enables the associated memory location 100 to be identified and accessed. Access comprises the loading or storing of the data word at the corresponding memory location 100.

A memory location is arranged for storing a data word or a check word which in each case comprise a number of bits or bytes in most cases.

FIG. 2 shows the memory area 1 from FIG. 1 with the multiplicity of memory locations 100. The external addresses EA allocated to the respective memory locations 100 are also shown. The totality of these exemplary addresses A1 to A20 is an address range which comprises the external addresses EA via which all memory locations 100 of the memory area 1 can be accessed. Thus, each memory location 100 of the memory area 1 can be accessed by applying its external address EA to the address input 3. In this allocation, no redundant memory locations are provided for protecting the stored data words.

In the allocation described above, an external address EA is allocated to each memory location 100. In this case, the address decoder operates in a first operating mode in which no protection by redundant memory locations 101 is provided. For the sake of illustration, FIG. 2 also shows internal addresses IA which are allocated to each memory location 100. These are in a given relationship with the external addresses EA and are identical in the simplest case, as shown.

The address decoder 2 can identify each memory location 100 by means of these internal addresses IA. This is also possible by means of the external addresses EA.

The address decoder 2 can be switched between the above-mentioned first operating mode and a second operating mode. In the second operating mode, only a part-memory area 25 of the total memory area 1 is available. No external address is allocated to the memory locations which are not available for access from the outside. These unaddressed memory locations 101 are provided for redundant information, so-called check words. Since only the part-memory area 25 is available for access, the range of external addresses EA is thus also restricted. They now only comprise a sub-address range. Apart from the fact that the sub-address range is smaller and comprises fewer external addresses than the total address range, the external addresses EA of the sub-address range are also present in the address range. From the outside, no difference can thus be detected in the operation of the memory apart from the reduced memory capacity. The internal allocation of the sub-address range 25 and the management of the redundant memory locations 101 is done internally by the address decoder 2.

For protecting the data, a number of data words are usually protected by a check word. In the memory arrangement, a record 10 with a number of memory locations 100, which can be accessed in each case by their associated external address EA is provided for this purpose. An unaddressed memory location 101 is correlated with the record 10. No external address EA is allocated to this unaddressed memory location 101. The check word can be allocated to the data words which are stored in the memory locations 100 of the record 10 via an arbitrary error-detecting or error-correcting code. Other allocations for generating redundant check words suitable for this purpose are also conceivable. Neither does the protection have to extend to every data word from the record 10, the protection of only a part of the data words by the check word is also conceivable.

FIG. 3 shows a first exemplary embodiment for providing the unaddressed memory locations 101 within the memory area 1.

In the exemplary embodiment shown, the allocation of the external addresses EA in the second operating mode is shown. The memory area 1 is as chosen in FIG. 2. For example, each record 10 comprises four memory locations 100. The sub-address range comprises the external addresses A1 to A16, for example. Each record 10 with four memory locations 100 is correlated with an unaddressed memory location 101 to which in itself no external address EA is allocated. Naturally, it is also conceivable to correlate more than one unaddressed memory location 101 with each record 10.

Every memory location 100, even the unaddressed memory locations 101 can be identified via a distance value D. The distance value D specifies the distance of the memory location from a given start address S. In FIG. 3, for example, it is indicated that the start address S is the first memory location 100 of the memory area 1 with the external address A1. In principle, the distance value D can be determined independently of the internal start address with a given external start address. Since, naturally, an internal start address also corresponds to the external start address, the distance value D can also be determined relative to the former. Both the memory locations 100 with external address EA and the unaddressed memory locations 101 can be unambiguously identified via the distance value D by adding the distance value D to the internal start address S.

In the exemplary embodiment of FIG. 3, the correlated unaddressed memory location 101 is provided after each record 10 so that its internal address IA follows the internal addresses IA of the memory locations 100 of the record 10 directly. This means that the distance value D must be incremented by the value 1 for each further record 10 after the start address S in order to specify the distance from the corresponding memory locations 100. In other words, this means that, for determining the first memory location of a record, its distance value D must be divided by four, i.e. the number of memory locations 100 of a record 10, and multiplied by five, i.e. this number in addition to the correlated unaddressed memory location 101.

In FIG. 3, internal addresses IA which correspond to the external addresses EA in the first operating mode are also shown in addition to the external addresses EA. Comparing the external addresses EA with the internal addresses IA makes the readdressing particularly clear.

The value which must be added to the distance value D increases with each block. For the memory locations 100 of the first record 10 with the external addresses A1 to A4, the distance value D does not change. Between the first record 10 and the second record 10 with the external addresses A5 to A8, an unaddressed memory location with the internal address A5 is provided. This increases the distance value D for identification of each memory location 100 of the second record by 1. For each of the memory locations 100 of the third record 10 with the external addresses A9 to A12, the distance value D increases by 2. This relationship can be described for the distance value D which is allocated to each external address EA in that an integral division is performed for the distance value D. The divisor is the number of memory locations 100 which is comprised by a record 10. The result is added to the previous distance value D.

This integral division can be performed in a particularly simple manner, and also implemented in hardware, when the addresses are present and managed in binary form. In this case, an integral division by 2 is a shift to the right by 1 bit. An integral division by 4 or 8 is a shift to the right by 2 or 3 bits, respectively. If the record comprises 4 bits, the distance value therefore only needs to be shifted to the right by 2 bits and the result added to the previous distance value. The unaddressed memory location 101 of the check word can be identified by adding the number of memory locations of the record, in the present case 4, to the new distance value D of the first memory location 100 of the record 10.

In the identification of the memory locations 100, 101 described above, the internal addresses IA are of subordinate significance since the actual identification is done by means of the distance value D.

Naturally, this method can also be modified by arranging the correlated unaddressed memory location 101 at the start of a record 10 or correlating more than one unaddressed memory location 101 with one record 10.

Figure 4:
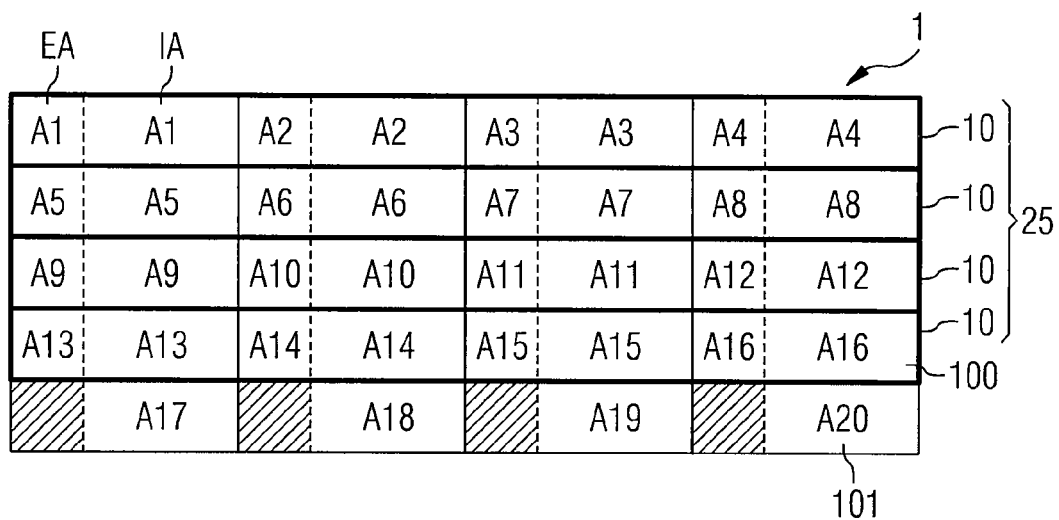
FIG. 4 shows a second allocation of external addresses to the memory locations of the part-memory area.

FIG. 4 shows a further embodiment of the allocation of the external addresses EA to the memory locations 100 in a second operating mode. In this case, a fixed part of the memory area 1 can be provided for the redundant data. Depending on whether the memory arrangement is operated in the first or second operating mode, external addresses EA are allocated to the memory locations in this part of the memory area 1, or not. Thus, the change in the allocation of the external addresses EA described in the first exemplary embodiment is omitted. In this exemplary embodiment, the external addresses EA and the internal addresses IA, if allocated, correspond to one another.

In this case, too, a record 10 comprises four memory locations 100, for example, with the external addresses A1 to A4 or A5 to A8. Each of these data records 10 is permanently correlated with an unaddressed memory location 101 in the second operating mode. In the case of the record 10 with external and internal addresses A1 to A4, this would be, for example, memory location 101 with the internal address A17. The addresses of the memory locations 100 of a record 10 and the address of the correlated unaddressed memory locations 101 thus have a given relationship to one another.

In the binary representation, the identification of the memory locations is simplified also in this exemplary embodiment as will be shown in the text which follows. If the memory area comprises $2^x$ memory locations, the address of the first memory location of a record with four memory locations is assumed to be 0, $a_{x-1}, a_{x-2}, \ldots, a_0$. This record is correlated with an unaddressed memory location with the corresponding internal address 1, 0, 0, $a_{x-1}, a_{x-2}, \ldots, a_2$. Thus, the internal address of the correlated unaddressed memory location can be generated in a simple manner from the internal addresses of the memory locations 100 of a record 10 by shifting the latter and appending them to a given bit sequence. In this case, too, the shifting depends on the number of memory locations in a record. In the example mentioned, the record comprises four memory locations, the address is shifted by the log 2, that is to say by two bits, and appended to a two-bit long pattern. Since the first bit of the internal address of the memory locations 100 of the record has a fixed value "1", the first bit of the address of the unaddressed memory location is also predetermined. This address manipulation can be implemented very simply in hardware.

During the operation of the memory arrangement, it can be determined for each memory area 1 of the memory array 5 whether it is operated in the first or second operating mode. Naturally, it is also conceivable that the memory arrangement only comprises one memory area 1 so that the total memory arrangement is operated either in the first or in the second operating mode. Due to the fact that the memory arrangement can be switched for each memory area 1, the memory can be optimally utilized since its volume can be flexibly adapted to the security requirements. Apart from the restricted availability of memory space in the second operating mode and the associated reduction in the address range, the internal memory management has no external effect on the operation since the resorting and identification of the correlated unaddressed memory locations takes place internally.

The invention claimed is:

1. A memory arrangement comprising:
   a memory area having a plurality of memory locations, wherein at least one external address is allocated to at least one of the plurality of memory locations; and
   an address decoder, which is coupled to the memory area and which comprises an address input configured to apply an external address,
   wherein the address decoder is configured to be switched so that one of the external addresses of an address range is allocated to each memory location of the memory area, or that one of the external addresses of a sub-address range of the address range is allocated to each memory location within only a part-memory area of the memory area, and
   wherein the address decoder is configured to access the memory location allocated for the applied external address.

2. The memory arrangement as claimed in claim 1, wherein at least one unaddressed memory location correlates with a record having a plurality of memory locations, wherein at least one external address is allocated to the at least one of the plurality of memory locations.

3. The memory arrangement as claimed in claim 2, wherein the address decoder is configured to access the correlating unaddressed memory location of the record.

4. The memory arrangement as claimed in claim 2, wherein the record comprises a plurality of memory locations with successive external addresses.

5. The memory arrangement as claimed in claim 1, wherein an internal address of each of the plurality of memory locations has a predetermined relationship to a corresponding external address of the memory location which is allocated from the address range.

6. The memory arrangement as claimed in claim 1, wherein the same external address from the address range is not allocated to each memory location of which at least one external address from the sub-address range is allocated.

7. The memory arrangement as claimed in claim 3, wherein the address decoder is configured to determine a distance value from a predetermined start address to each external address, the allocated memory location being identifiable by the distance value.

8. The memory arrangement as claimed in claim 7, wherein the address decoder is configured to add the distance value subjected to an integral division to the distance value in order to modify the distance value.

9. The memory arrangement as claimed in claim 8, wherein the unaddressed memory location is identified by the modified distance value, of one of the memory locations of the correlating record.

10. The memory arrangement as claimed in claim 4, wherein the same external address from the address range is allocated to each memory location of which at least one external address from the sub-address range is allocated.

11. The memory arrangement as claimed in claim 10, wherein internal addresses of unaddressed memory locations have a predetermined relationship to internal addresses of the memory locations of the correlating record; wherein said predetermined relationship comprises an integral division.

12. The memory arrangement as claimed in claim 8, wherein the number of memory locations which the record comprises is a power to the base 2 and, in a case of a binary representation of the operand of the integral division, this comprises a shifting to the right by the log 2 of the number.

13. The memory arrangement as claimed in claim 4, wherein the memory arrangement comprises a correlator that correlates and stores in the correlated unaddressed memory location, a check word with data words stored in the memory locations of the record.

14. The memory arrangement as claimed in claim 10, wherein the number of memory locations which the record comprises is a power to the base 2 and, in a case of a binary representation of the operand of the integral division, this comprises a shifting to the right by the log 2 of the number.

15. A memory arrangement comprising:
   a memory area having a plurality of first and second memory locations, wherein external addresses are allocated for these memory locations; and
   an address decoders, which is coupled to the memory area and which comprises an address input configured to apply an external address, wherein the address decoder is configured to operate in:
      a first mode, wherein one of the external addresses of an address range is allocated to each of the first and second memory locations of the memory area, and
      a second mode, wherein one of the external addresses of a sub-address range of the address range is only allocated to each of the first memory locations of the memory area, wherein each of the first memory locations is allocated to one of a plurality of records and each of the records correlates with at least one of the second memory locations, wherein the address decoder is configured to access the memory location allocated for the applied external address.

16. The memory arrangement as claimed in claim 15, wherein each of the first and second memory locations has an internal address, wherein external start addresses of the address range are allocated to the memory locations with internal start addresses.

17. The memory arrangement as claimed in claim 16, wherein, in the first operating mode, the address decoder determines a distance of the applied external address from the external start address and accesses the memory location, wherein the internal address of the memory location is the sum of the distance and of the internal start address.

18. The memory arrangement as claimed in claim 16, wherein, in the second operating mode, the address decoder determines a distance of the applied external address from the external start address and accesses the memory location, wherein the internal address of the memory location a sum of the internal start address of the distance and of a value, wherein the value comprises a result of an integral division of the distance via the number of memory locations in one of the records.

19. The memory arrangement as claimed in claim 18, wherein, in the second operating mode, the internal address of one of the second memory locations comprises a sum of the internal start address and the integral division of the distance of one of the external addresses and the number of memory locations in one of the records.

20. The memory arrangement as claimed in claim 16, wherein, in the second operating mode, the address decoder determines a distance of the external address applied from the external start address and accesses the memory location, wherein the internal address of the memory location is a sum of the distance and of the internal start address.

21. The memory arrangement as claimed in claim 20, wherein, in the second operating mode, the internal address of one of the second memory locations comprises a sum of the internal start address, which is a predetermined value, and the integral division of the distance of one of the external addresses.

22. A method for operating a memory arrangement comprising an address decoder, having an address input, and a memory area having a plurality of memory locations, wherein the memory locations are accessible via an external address that is applied to the address input, the method comprising:

in a first operating mode, allocating an external address of an address range to each memory location of the memory area; and in a second operating mode, allocating an external address of a sub-address range of the address range to each memory location within only a part-memory area of the memory area.

23. The method as claimed in claim 22, further comprising, in the second operating mode, correlating an unaddressed memory location with a record having a number of memory locations, wherein at least one external address is allocated to at least one of the plurality of memory locations.

24. The method as claimed in claim 23, wherein the record comprises a plurality of memory locations with successive external addresses.

25. The method as claimed in claim 22, wherein, in the first operating mode, the allocating step further comprises allocating to each memory location an internal address which has a predetermined relationship to the external address.

26. The method as claimed in claim 22, wherein, in the first operating mode, the same external address is not allocated to each memory location of which at least one external address is allocated.

27. The method as claimed in claim 23, further comprising, in the first operating mode, allocating to each external address, a distance value from a predetermined start address by which the associated memory location is identified, wherein the distance value is not changed in the first operating mode.

28. The method as claimed in claim 27, further comprising, in the second operating mode, modifying the distance value by adding to the distance value the distance value subjected to an integral division based on the number of memory locations of the record.

29. The method as claimed in claim 28, further comprising identifying an unaddressed memory location by the modified distance value of one of the memory locations of the correlating record.

30. The method as claimed in claim 23, further comprising, in the first operating mode, allocating the same external address to each memory location of which at least one external address is allocated in the second operating mode.

31. The method as claimed in claim 30, further comprising determining internal addresses of unaddressed memory locations by integrally dividing the internal addresses of the memory locations of the correlating record.

32. The method as claimed in claim 28, wherein the number of memory locations which comprise the record is a power to the base 2 and, in a case of a binary representation of the operand of the integral division, comprises a shifting to the right by the log 2 of the number.

33. The method as claimed in claim 23, wherein the method further comprises:

storing data words in the memory locations of the record to correlate with a check word; and storing the check word in the correlating unaddressed memory location.

34. The method as claimed in claim 30, wherein the number of memory locations which comprise the record is a power to the base 2 and, in a case of a binary representation of the operand of the integral division, comprises a shifting to the right by the log 2 of the number.

35. A method for operating a memory arrangement comprising an address decoder, having an address input, and a memory area comprising a plurality of first and second memory locations, wherein the memory locations are accessed via an external address that is applied to the address input, the method comprising:

in a first operating mode, allocating an external address of an address range to each first and each second memory location of the memory area; and in a second operating mode, allocating an external address from a sub-access range of the address range to only the first memory locations of the memory area, wherein each of the first memory locations are allocated to one of a plurality of records and at least one second memory location correlates with each of the plurality of records.

36. The method as claimed in claim 35, wherein each of the first and each of the second memory locations has an internal address, and an external start address of the address range is allocated to each memory location with an internal start address.

37. The method as claimed in claim 36, further comprising, in the first operating mode:

determining a distance of the applied external address from the external start address; and accessing the memory location, wherein the internal address of the memory location a sum of the distance and the internal start address.

38. The method as claimed in claim 36, further comprising, in the second operating mode:

determining a distance of the applied external address from the external start address; and accessing the memory location, wherein the internal address of the memory location a sum of the internal start address of the distance and of a value, wherein the value is an integral division of the distance by the number of memory locations in one of the records.

39. The method as claimed in claim 38, wherein, in the second operating mode, the internal address of one of the second memory locations comprises a sum of the internal start address and a product of the integral division of the distance of one of the external addresses and the number of memory locations in one of the records.

40. The memory arrangement as claimed in claim 36, further comprising, in the second operating mode:

determining a distance of the applied external address from the external start address; and accessing the memory location, wherein the internal address is a sum of the distance and the internal start address.

41. The memory arrangement as claimed in claim 40, wherein, in the second operating mode, the internal address of one of the second memory locations comprises a sum of the internal start address, which is a predetermined value, and an integral division of the distance of one of the external addresses.

* * * * *

UNITED STATES PATENT AND TRADEMARK OFFICE
CERTIFICATE OF CORRECTION

PATENT NO. : 7,468,931 B2  Page 1 of 1
APPLICATION NO. : 11/458243
DATED : December 23, 2008
INVENTOR(S) : Andreas Wenzel et al.

It is certified that error appears in the above-identified patent and that said Letters Patent is hereby corrected as shown below:

In the Specification:
At col. 4, line 7, after "to" delete "the".

In the Claims:
In Claim 9, col. 10, line 27, delete "value," and insert -- value --, therefor.
In Claim 15, col. 10, line 57, delete "decoders," and insert -- decoder, --, therefor.
In Claim 18, col. 11, line 22, delete "location a" and insert -- location is a --, therefor.

Signed and Sealed this

Twenty-first Day of April, 2009

JOHN DOLL
*Acting Director of the United States Patent and Trademark Office*